United States Patent [19]
Ramsden

[11] Patent Number: 5,818,222
[45] Date of Patent: Oct. 6, 1998

[54] METHOD FOR ADJUSTING FERROUS ARTICLE PROXIMITY DETECTOR

[75] Inventor: Edward A. Ramsden, Penacook, N.H.

[73] Assignee: The Cherry Corporation, Waukegan, Ill.

[21] Appl. No.: 473,225

[22] Filed: Jun. 7, 1995

[51] Int. Cl.⁶ .............................. G01R 35/00; G01B 7/14
[52] U.S. Cl. ........................ 324/202; 324/207.2
[58] Field of Search ............................ 324/202, 207.12, 324/207.2, 251; 338/32 H; 327/510, 511

[56] References Cited

U.S. PATENT DOCUMENTS

| | | |
|---|---|---|
| 2,930,944 | 3/1960 | Yonkers et al. . |
| 2,942,177 | 6/1960 | Neumann et al. . |
| 2,987,669 | 6/1961 | Kallmann . |
| 3,060,370 | 10/1962 | Varterasian . |
| 3,219,909 | 11/1965 | Foster ........................................ 324/251 |
| 3,243,696 | 3/1966 | Lovell et al. . |
| 3,389,333 | 6/1968 | Wolff et al. ............................. 324/225 |
| 3,613,000 | 10/1971 | Weir et al. . |
| 3,708,727 | 1/1973 | Wielebski et al. . |
| 3,902,144 | 8/1975 | Fischer et al. . |
| 4,039,936 | 8/1977 | Jones et al. . |
| 4,086,533 | 4/1978 | Ricouard et al. . |
| 4,093,917 | 6/1978 | Haeussermann . |
| 4,107,604 | 8/1978 | Bernier . |
| 4,156,191 | 5/1979 | Knight et al. ........................... 324/202 |
| 4,229,696 | 10/1980 | Gustafson . |
| 4,295,118 | 10/1981 | Herr et al. . |
| 4,296,410 | 10/1981 | Higgs et al. . |
| 4,322,709 | 3/1982 | Vonder et al. . |
| 4,443,716 | 4/1984 | Avery . |
| 4,518,918 | 5/1985 | Avery . |
| 4,535,289 | 8/1985 | Abe et al. . |
| 4,731,579 | 3/1988 | Petersen et al. . |
| 4,782,293 | 11/1988 | Steingroever et al. . |
| 4,859,941 | 8/1989 | Higgs et al. . |
| 4,935,698 | 6/1990 | Kawaji et al. . |
| 4,982,155 | 1/1991 | Ramsden . |
| 5,045,920 | 9/1991 | Vig et al. . |
| 5,084,674 | 1/1992 | Lachmann et al. . |
| 5,117,183 | 5/1992 | Santos . |
| 5,192,877 | 3/1993 | Bittebierre et al. . |
| 5,351,003 | 9/1994 | Bauer et al. . |

FOREIGN PATENT DOCUMENTS

| | | |
|---|---|---|
| 3636079 | 5/1988 | Germany . |
| 52-34755 | 3/1977 | Japan . |
| 62-6155 | 1/1987 | Japan . |
| 62-6159 | 1/1987 | Japan . |

Primary Examiner—Walter E. Snow
Attorney, Agent, or Firm—Choate, Hall & Stewart

[57] ABSTRACT

An improved proximity detector comprising a hall effect sensor affixed to a permanent magnet, where the improvement comprises tuning the operational gradient of the magnetic field normal to the face of the detector. An apparatus and method for tuning the operational gradient of the magnetic field normal to the face of the detector is also discloses and utilizes means for generating magnetic fields parallel and perpendicular to the face of the magnetic proximity detector. The tuning apparatus changes the gradient through the application of magnetic tuning fields to the sensor magnetic, thereby changing the operational gradient axis, the operational gradient strength or both.

20 Claims, 5 Drawing Sheets

5,818,222

METHOD FOR ADJUSTING FERROUS ARTICLE PROXIMITY DETECTOR

FIELD OF THE INVENTION

The Invention relates generally to proximity sensors for detecting the passage of ferromagnetic articles, and more particularly to such a sensor assembly comprising a magnet and a sensor element for detecting spatial magnetic field gradients, said sensor element being affixed to one of the pole faces of the magnet.

BACKGROUND OF INVENTION

The ferrous article sensors utilizing dual or differential sensor elements have been in use for several years. For instance, U.S. Pat. No. 4,518,918, to Avery, discloses the basic principle underlying the operation of this class of devices wherein a ferrous object in proximity to the face of a magnet produces a measurable gradient or change in the magnetic flux normal to the magnet face. By interposing a sensor able to detect such a gradient between the magnet face and the ferrous object of interest, a proximity detector can be realized. Because this type of proximity detector is sensitive to gradients of magnetic field, it is especially useful in detecting edges of nearby ferrous objects, such as gears, and for this reason is often referred to as a "geartooth sensor." This class of proximity detectors, however, suffer from the following problems:

1) Magnets do not have uniform normal fields on their faces. This lack of uniformity results in reduced sensitivity or complete malfunction of the proximity detector.

2) In using dual or differential sensor elements, mismatches in the sensor elements or the associated signal processing circuitry causes errors. Such errors result in effects similar to magnet non-uniformities. These errors are the result of random variation in the sensor element manufacturing process and cannot be totally eliminated.

3) Overmolding or potting of the finished assemblies (magnet and sensor element) causes the molding or potting material to exert mechanical stresses on the sensor elements. Such mechanical stresses contribute additional offset errors.

The prior art discloses various methods for reducing these problems. A first class of prior art, as illustrated by U.S. Pat. No. 4,859,941, to Higgs et al., U.S. Pat. No. 4,935,698, to Kawaji et el., and U.S. Pat. No. 5,192,877, to Bittebierre et al., teaches methods for reducing the effects of magnet non-uniformity through the use of a ferrous polepiece inserted between the pole face of the magnet and the differential sensor element. These methods, however, provide no compensation for sensor element offset errors or post-assembly encapsulation-induced errors. Moreover, by increasing the distance between the magnet poleface and the sensor element, these methods also reduce the effective sensitivity of the finished proximity sensor from the maximum attainable with the sensor element affixed directly to the magnet face.

A second class of prior art for correcting problems with differential magnetic proximity detectors teach techniques of mechanically manipulating the physical positions of the magnet, the sensor, or an auxiliary polepiece relative to each other in an effort to tune the final proximity detector. Such tuning is targeted to a given performance criteria, such as maximizing the distance at which it can reliably detect a given target. The following tuning techniques are known:

a) Sliding the sensor element along the face of the magnet in the axis of the detected gradient. While this technique is straightforward to implement in the laboratory, it is extremely difficult to economically implement in a production environment for the following reasons; the operation is extremely sensitive to mechanical mispositioning errors, requiring positioning tolerances on the order of 0.001" (25 $\mu$m), and because maintaining this level of positioning accuracy is difficult since there is generally no way to affix the sensor element to the magnet face other than by using an adhesive.

b) Sliding a ferrous shim around the unused face of the magnet. This technique suffers from the same disadvantages as the previously described one, and requires an additional component to construct the proximity sensor assembly.

c) Positioning the sensor element in a holder which maintains the sensor element and a cylindrical magnet in close spatial proximity as disclosed in U.S. Pat. No. 5,045,920, to Vig et al. The resulting assembly is tuned by rotating the magnet within the holder. One problem with this technique is that a significant proportion of assemblies produced will be untunable, because not all magnets will have points along the circular portion of their face being used for tuning where the necessary magnetic field gradients exist.

In addition to the specific problems cited above, all of the above techniques further suffer from the effects of post-assembly encapsulation operations, which can reduce overall manufacturing yield to unacceptable levels.

A third class of prior art for making differential magnetic proximity detectors relies upon measuring only the time-varying component of the detected magnetic field. U.S. Pat. No. 4,982,155, to Ramsden, and U.S. Pat. No. 5,084,674, to Lachmann et al., describe techniques where only the AC component of the signal from the differential sensor element is used. These techniques eliminate the effects of sensor element placement on the magnet, but also place a lower bound on the slowest speed at which a nearby target may be detected, as well as introducing phase shifts as artifacts of the filter used to isolate the AC component of the measured magnet field gradient. These two characteristics make this type of sensor unsuitable for use in applications where low frequency operation is required, such as wheel speed detection for automobile anti-lock braking systems, and in applications where phase shifts are unacceptable, such as automobile engine ignition timing sensors.

Therefore, it is an object of the invention to provide a dual magnetic sensor element ferrous article proximity detector which does not require mechanical tuning operations to compensate for magnet non-uniformities or for sensor element offsets. It is a further object of the invention to provide a dual magnetic sensor element ferrous article proximity detector which is not susceptible to performance degradation introduced by post-assembly operations such as encapsulation operations, such as overmolding or potting. It is also an object of the invention to provide a dual magnetic sensor element ferrous article proximity detector which can detect targets moving at arbitrarily low speeds.

SUMMARY OF INVENTION

A tuned magnetic proximity detector is disclosed. The detector comprises a Hall-effect sensor mounted with a tuned or adjusted permanent magnet. The tuned magnetic proximity detector is produced by first determining the operational gradient of the magnetic field as measured normal (perpendicular) to the sensor face. The difference between the measured operational gradient and an ideal operational gradient is determined, which is then utilized to determine a tuning field which is applied to the sensor. The tuning field changes the field of the permanent magnet and thereby changes the operational gradient, effectively tuning the gradient to more accurately reflect the ideal operational gradient.

A method of tuning the operational gradient of magnetic proximity detector is also disclosed. The method includes the steps of measuring the operational gradient of the magnetic proximity detector. The measured operational gradient is utilized to determine the modification field to apply to the detector. The operational gradient can be used to index into a table of predetermined modification gradient values, used as a value in an equation which generates the modification gradient values, or utilized in a combination lookup table and calculation. The resulting modification magnetic field values are utilized to apply a modification filed to the sensor. The operational magnetic field is then measured again, with further tuning steps repeated as needed.

A tuning apparatus is disclosed which adjusts magnetic proximity detectors. The apparatus comprises a fixture which secures the sensor about an axis perpendicular to the face of the sensor. An operation detector applies a known field gradient to the face of the sensor and detects the operation of the Hall-effect sensor. The applied gradient can be changed until the operation of the Hall-effect sensor is detected. The value of the applied gradient is then utilized to determine the appropriate modification field to apply to the sensor via a set of modification magnetic field generators. Computation means control the modification magnetic field generators depending upon the value of the gradient applied by the detector. The computation means can be based upon digital or analog circuitry.

DESCRIPTION OF THE PREFERRED EMBODIMENTS

Figure 1:
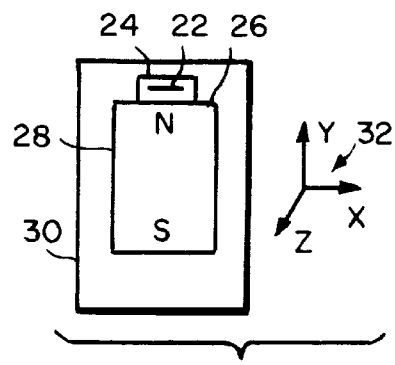
FIG. 1 shows a prior art assembly comprising a differential sensor element affixed to a magnet face.

A prior art differential magnetic proximity detector is illustrated in FIG. 1. A magnetic sensor IC 22 in a suitable package 24 is affixed to one of the pole faces 26 of a permanent magnet 28. The resulting assembly may then be further packaged, through a process such as encapsulation or potting, into a complete sensor assembly 30. Spatial orientation 'xyz' reference axis 32 are also shown, these reference axis being common to all relevant drawings in this patent.

Figure 2:
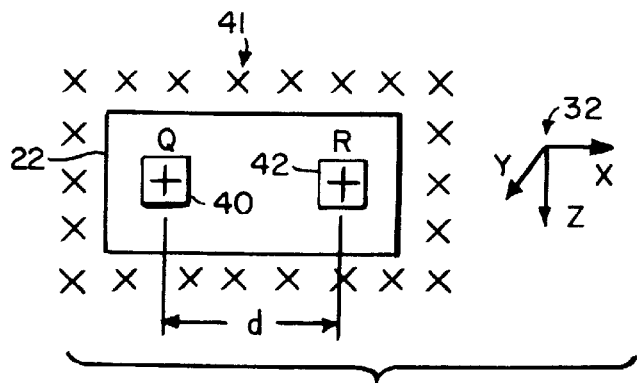
FIG. 2 shows the construction of a prior art gradient sensor IC with two Hall-effect sensors.

This proximity detector assembly 30 is designed to be sensitive to field or flux gradients in the 'y' component of the magnetic field emanating from the poleface 26 of the permanent magnet 28 as measured in the 'x' direction ($\delta B_y/\delta x$). FIG. 2 shows one way in which such a gradient sensor IC 22 may be realized. Two magnetic sensors (typically Hall-effect or magneto-resistive), 'Q' 40 and 'R' 42 are fabricated coplanar to the 'xz' plane indicated by reference axis 32, with a sensitivity to the 'y' component of any local incident magnetic fields 44, and are separated by distance 'd'. By subtracting the measurements from the two sensors, a reading of $(B_{yQ}-B_{yR})/d$ is obtained, which for small values of 'd' approximates the true gradient ($\delta B_y/\delta x$).

Figure 3:
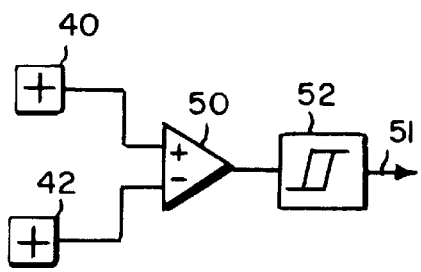
FIG. 3 shows the schematic for a prior art gradient sensor with signal processing.

FIG. 3 shows the signal processing circuitry needed to implement a practical gradient sensor IC 22. The signals from the two magnetic sensors 40 and 42 are subtracted by differencing amplifier 50. The resulting difference signal is then sent to a threshold detector circuit 52. Threshold detector 52 is designed so that its output 54 switches to an 'ON' state when the detected gradient field is greater than a specified operate point (Bop), and switches to an 'OFF' state when the detected gradient is less than a specified release point (Brp). For most applications, Bop and Brp will be selected so that Brp=−Bop, and the absolute values of the Bop and Brp gradient thresholds are on the order of 1–10 Tesla/meter for practical sensor ICs.

Figure 4:
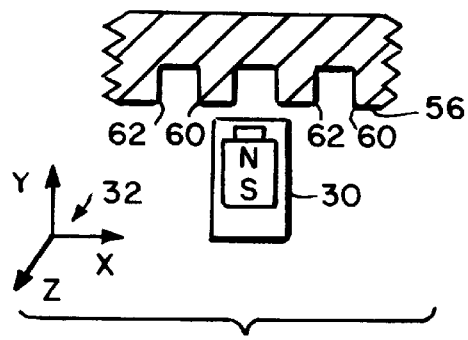
FIG. 4 shows how the prior art geartooth sensor assembly is used to detect gear teeth.

FIG. 4 shows how the sensor assembly 30 is oriented to detect a ferrous target, typically, but not necessarily, gear teeth. The left edges 60 and right edges 62 of the gear teeth respectively induce positive and negative gradients in the magnetic field at the face of the sensor assembly 30 when they are aligned directly over the center of the assembly. These gradients are induced due to the magnetic concentrating effect of the material of the gear tooth as opposed to the adjacent free space.

Figure 5A:
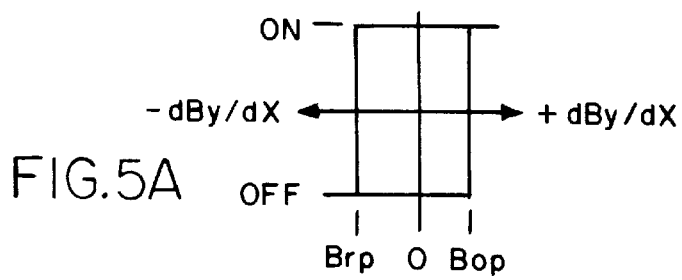
FIGS. 5A, 5B, 5C show actuation characteristics of sensor assemblies with and without offsets.
Figure 5B:
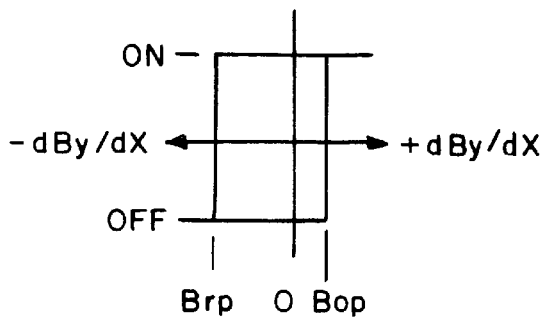
Figure 5C:
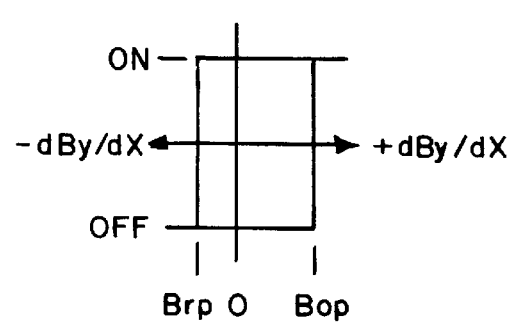

FIGS. 5A, 5B and 5C, illustrate Bop and Brp characteristics of a sensor assembly. Because of offsets in the sensor IC and intrinsic field gradients in a magnet, a given sensor assembly may not have symmetric Bop and Brp characteristics. FIG. 5B illustrates asymmetric Brp and Bop operate/release characteristics of an assembly with a significant negative offset, while FIG. 5C illustrates asymmetric Brp and Bop operate/release characteristics of assembly with significant positive offset. For most applications, the symmetric characteristics illustrated in FIG. 5A are the most desirable.

A key part of this invention is a method of characterizing the Bop and Brp points of a complete sensor assembly. This requires a means for generating gradients in the magnetic field at the face of the assembly. One method for generating gradients in the magnetic field is by using a spinning ferrous gear, or other moveable ferrous target. Yet, this is not the best method for two reasons:

1) It is difficult to correlate the position of the target and the generated gradient, especially since the gradient will be a strong function of the strength of the magnet in the sensor assembly.
2) The ferrous target will distort the field in a manner peculiar to the shape and composition of that particular target. Measurements made with respect to a characterizing target may not be useful in predicting sensor assembly performance with respect to any other target.

Figure 6A:
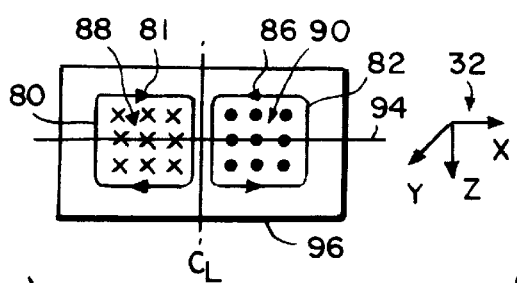
FIGS. 6A, 6B show the construction of a magnetic field gradient generator.
Figure 6C:
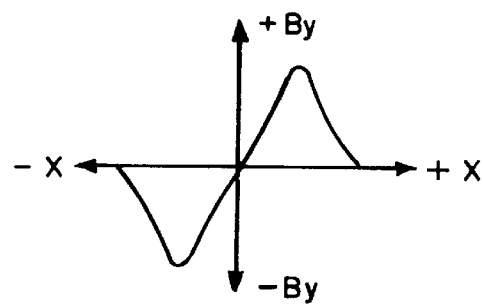
FIG. 6C shows the output of a magnetic field gradient generator.
Figure 6B:
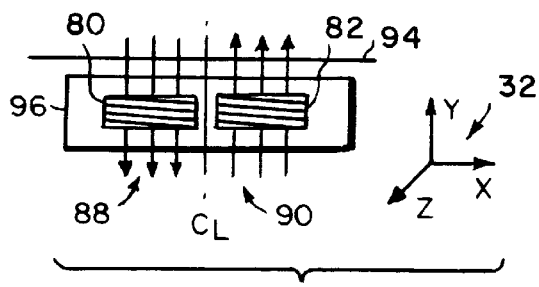

FIGS. 6A and 6B show a preferred embodiment of a means for generating an arbitrary magnetic gradient field. In FIG. 6B, two coils, 80 and 82, are placed adjacent to each other and coplanar to the xz plane illustrated by reference axis 32. With reference to FIG. 6A, a clockwise current 84 is made to flow through coil 80, while a counterclockwise current 86 is made to flow through coil 82. This arrangement induces a magnetic field 88 with a negative 'y' component through coil 80 and a magnetic field 90 with a positive 'y' component through coil 82, as illustrated in FIG. 6B showing a side view of this embodiment.

FIG. 6C shows the overall 'y' component magnetic field as measured along the reference axis 94 a short distance in the 'y' direction above the gradient generator assembly 96. The slope of the field curve illustrated in FIG. 6C shows that a gradient field exists along the reference axis, here the x axis. Because this field will be proportional to the magnitude and sign of the excitation currents 84 and 86 used to drive the coils, the sign and magnitude of the gradient field are readily controllable. For small generator assemblies (coil diameter 1 cm) it is possible to generate gradients on the order of +/−5–10 Tesla/meter with a few hundred ampere-turns. The addition of ferrous cores into the coils of the generator assembly allows for the creation of higher gradient with less power, but is not preferred because of the interaction of such cores with the bias field emanating from the magnet in the sensor assembly.

Figure 7:
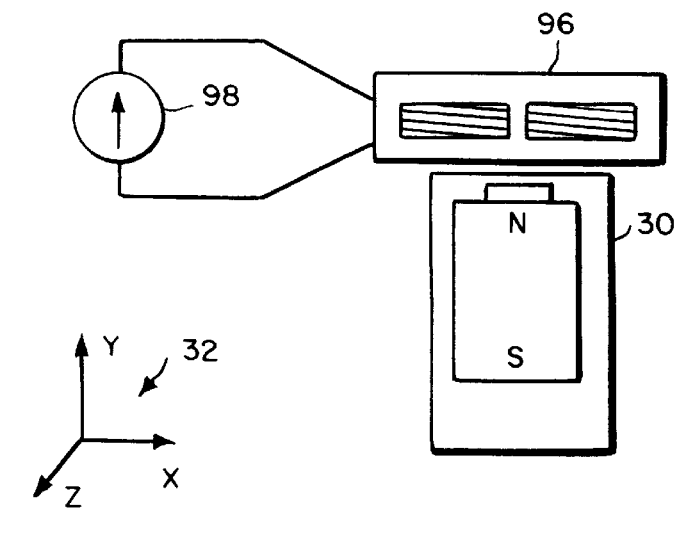
FIG. 7 shows how the gradient generator is used to actuate the sensor assembly.

A sensor assembly is characterized by the gradient generator shown in FIG. 7 through the following process:

1) The sensor assembly 30 is placed in proximity to the gradient generator assembly 96 as shown in FIG. 7.
2) The gradient generator assembly is driven by current source 98 with current so that it produces a maximum negative gradient, so as to actuate the sensor assembly to an 'off' state.
3) The current through the gradient generator assembly is then ramped up by current source 98 until the sensor assembly actuates to an 'on' state. This value is taken as Bop.
4) The current through the gradient generator assembly is then ramped down by current source 98 until the sensor assembly returns to an 'off' state. This value is taken as Brp.

Figure 8A:
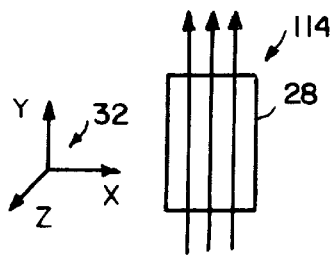
FIGS. 8A–8F show the effects of rotating the magnetization axis of a magnet.
Figure 8C:
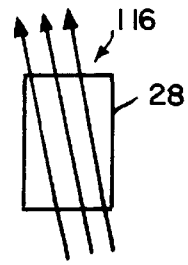
Figure 8E:
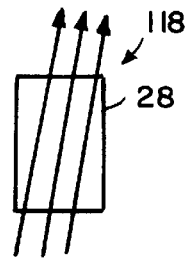
Figure 8B:
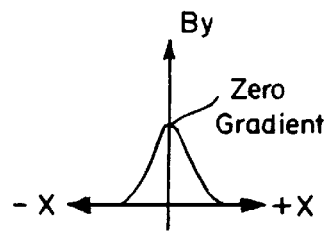

For most applications, a sensor assembly with Brp =−Bop relationship is desired. A sensor assembly may be tuned to such a relationship by rotating the axis of magnetization of the bias magnet 28. FIG. 8A shows the bias magnet 28 with a normal axis of magnetization 114. FIG. 8B is a graph showing the poleface-normal component of field at the face of the magnet. It is symmetric about the central axis of the magnet 28 and has a gradient of 0 at the center point of the poleface. FIG. 8C shows a bias magnet 28 with the axis of magnetization rotated counterclockwise 116, which produces the poleface-normal component of field illustrated in the graph of FIG. 8D. The poleface normal component of field is asymmetric about the central axis of the magnet 28 and has a negative gradient at the center of the poleface. It is possible to use such a negative gradient to null out a positive offset in the sensor IC. FIG. 8E shows a bias magnet with the axis of magnetization rotated clockwise, which produces the face profile of FIG. 8F, providing a positive gradient at the center of the poleface. This positive gradient may be used to null out a negative offset in the sensor IC.

Figure 9A:
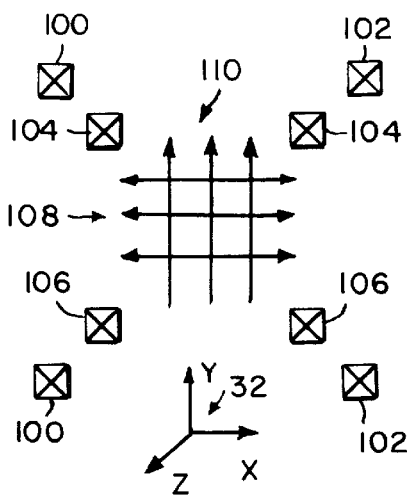
FIGS. 9A, 9B show an arrangement of coils for rotating the magnetization axis of a magnet.
Figure 9B:
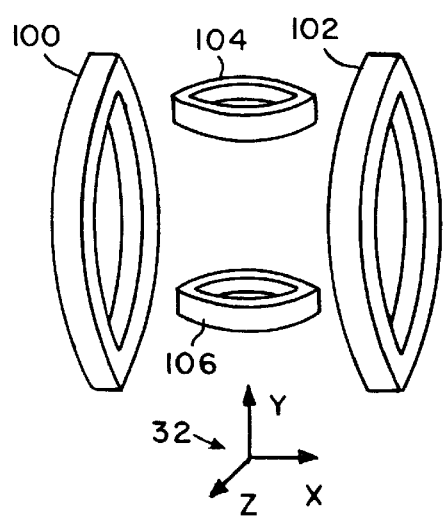

A magnet's axis of magnetization may be rotated and, as a result, the sensor assembly of which it is a part of may be tuned. This may be accomplished by applying a pulsed magnetic field with a magnitude and direction based on the direction in which one wants to shift the Bop and Brp points of the assembly. FIG. 9A shows a cross-sectional view of a preferred embodiment for an electromagnet assembly, illustrated in FIG. 9B, capable of providing the necessary magnetic fields. Helmholtz coils 100 and 102 are used to provide an 'x' oriented field with either a positive or negative orientation 108. Helmholtz coils 104 and 106 provide a 'y' oriented bias field of positive magnitude 110. While the Helmholtz form is illustrated here for purposes of clarity, any arrangement of electromagnets capable of generating arbitrary strength fields of arbitrary direction may be used.

Figure 8D:
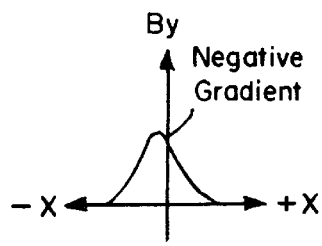
Figure 8F:
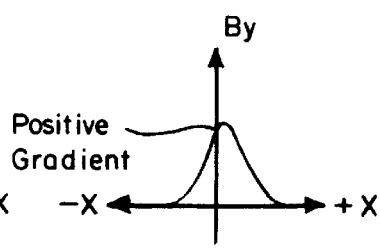
Figure 10:
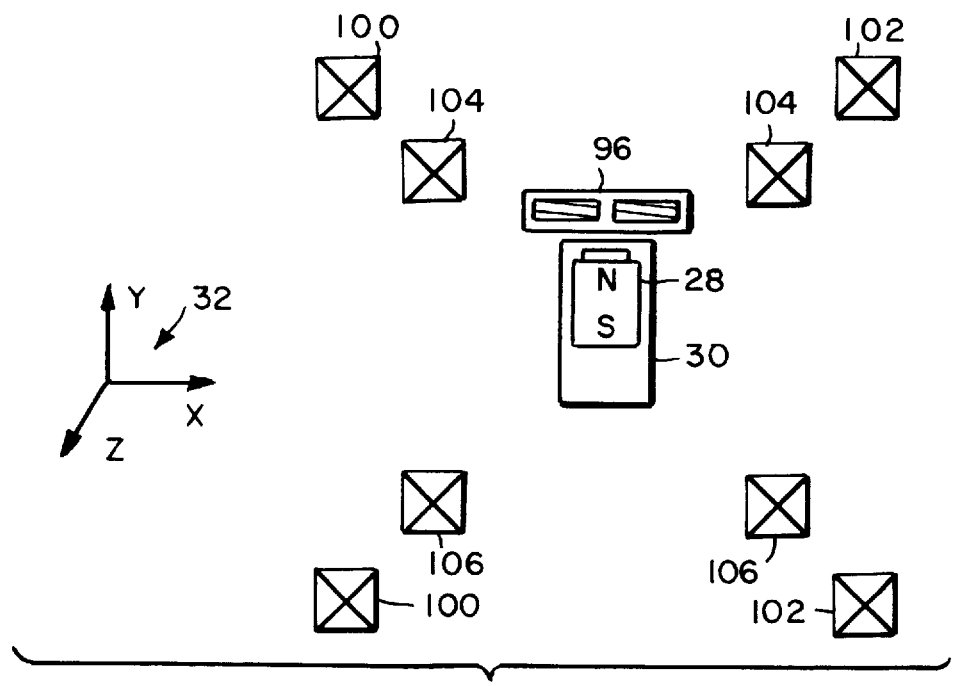
FIG. 10 shows fixturing for characterizing and tuning sensor assemblies.

FIG. 10 is a cross-sectional view showing the orientation of the sensor assembly 30 and gradient assembly 96 relative to the tuning coils 100, 102, 104 and 106. Coils 100 and 102 are utilized to produce a positive 'x' pulse which will rotate the field of magnet 28 in a clockwise direction, as illustrated in FIG. 8E. This will cause a positive gradient at the center of magnet 28 as shown in FIG. 8F. This positive gradient will reduce the effective values of Bop and Brp, and can be used for shifting the actuation characteristics of assembly 30 from an initial state, such as that illustrated in FIG. 5C, towards the more desirable actuation characteristics shown in FIG. 5A.

Coils 100 and 102 are utilized to produce a negative 'x' pulse which will rotate the field of magnet 28 in a counter-clockwise direction, as illustrated in FIG. 8C. This will cause a negative gradient at the center of magnet 28 as shown in FIG. 8D. This negative gradient will increase the effective values of Bop and Brp, and can be used for shifting the actuation characteristics of assembly 30 from an initial state, such as that illustrated in FIG. 5B, towards the more desirable actuation characteristics shown in FIG. 5A.

While it is possible to alter the actuation characteristics of the sensor assembly by using just the 'x' oriented coils 100 and 102 alone, it is desirable to provide a 'y' oriented field 110 with coils 104 and 106 for the following reasons:

1) Conducting the tuning process exclusively with the 'x' oriented magnetic pulses 108 is more difficult in that there is less predictability in how Bop and Brp change in response to a given pulse magnitude.
2) Conducting the tuning process exclusively with 'x' oriented magnetic pulses 108 seriously degrades the 'y' field strength of the magnet in the sensor assembly. This reduces the effective sensitivity of the sensor assembly. For an Alnico-8 magnet, this degradation was noted to be greater than 50% of the original strength before tuning.
3) Conducting the tuning process exclusively with 'x' oriented magnetic pulses 108 moves the magnetization of the magnet material around its hysteresis curve significantly more than conducting the tuning process with additional simultaneous 'y' oriented pulses 110, causing excessive heating of the magnet material from hysteresis losses.

For an Alnico-8 magnet in a sensor assembly, field levels of 5000–10,000 Oersteds have been found to be sufficient to significantly shift the Bop and Brp points of the sensor assembly. In a prototype tuning fixture, the magnitude of the 'y' oriented field was fixed at approximately 1.5 times the magnitude of the 'x' oriented field, thus simplifying the control problem of selecting individual magnitudes for the 'x' field 108 and 'y field 110.

Figure 11:
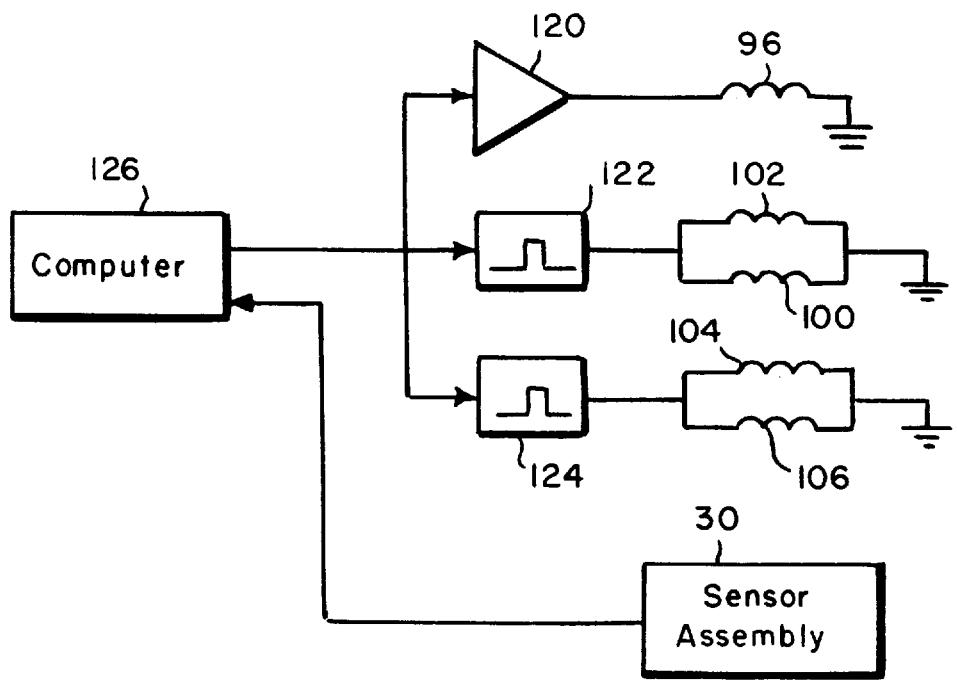
FIG. 11 shows a block diagram illustrating additional portions of the fixture for characterizing and tuning sensor assemblies.

FIG. 11 shows additional components for an embodiment of the fixture. A controllable current source, such as a linear amplifier, 120 is used to provide current (typically a few amperes at 0–10 Volts) to drive the gradient generator assembly 96. Controllable power sources, such as pulse generators, 122 and 124, typically capable of delivering pulses with maximum power levels of 200–300 volts, 100–200 Amperes for a few milliseconds, are used for driving the tuning coils 100, 102, 104 and 106. An analog or digital computer 126 is utilized for automatically controlling the tuning process. The computer monitors the output of the sensor assembly 30 being tuned.

Figure 12:
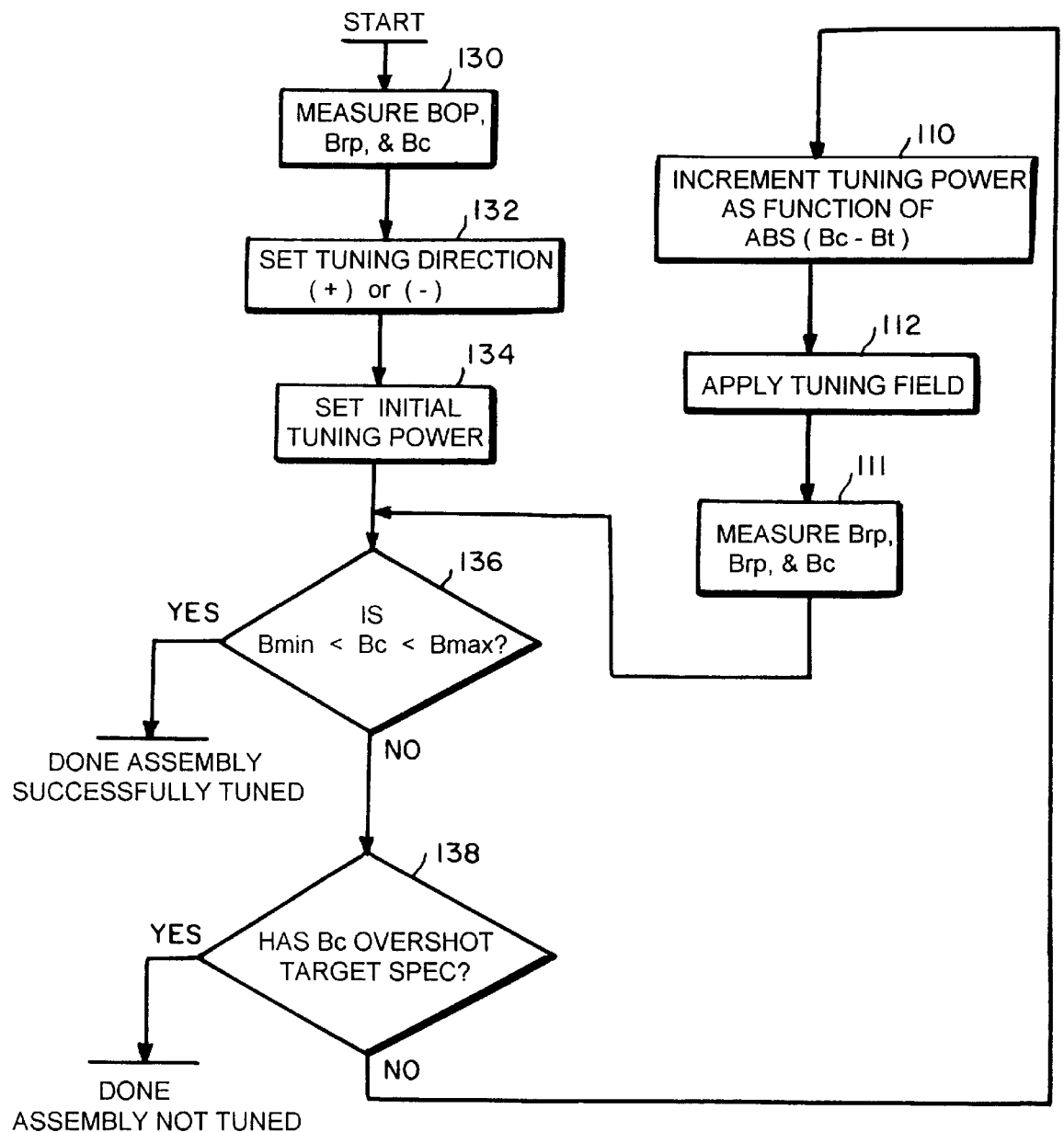
FIG. 12 shows the flowchart for an algorithm that can be used to tune sensor assemblies.

FIG. 12 shows a flowchart describing a preferred embodiment of the tuning process.

For this algorithm, while not required, the ratio of power delivered to the 'y' tuning field coils is assumed to be fixed with respect to the power delivered to the 'x' tuning field coils, nominally at a ratio of 1.5:1. This algorithm also assumes that the magnet has already been magnetized with a 'y' orientation. The first step 130 is to measure the Bop, Brp, and Bc defined as (Bop+Brp)/2 points of the untuned sensor assembly, using the method described earlier. The next step 132 is to set a tuning direction based on the difference between Bc and a predetermined target Bt. Although the value of Bt is typically selected to be "0", it may be selected as an arbitrary value for a particular application of the sensor assembly. If Bc<Bt, as shown in FIG. 12, then the tuning direction is set to negative, meaning that the 'x' tuning coils 100 and 102 will be energized so as to induce a negative 'x' tuning field, rotating the bias magnet's field counterclockwise, thereby increasing the values of Bop and Brp. If Bc>Bt then the tuning direction is set to positive, meaning that the 'x' tuning coils 100 and 102 will be energized so as to induce a positive 'x' tuning field, rotating the bias magnet's field clockwise, thereby decreasing the values of Bop and Brp. The next step 134 is to set an initial current tuning field power level (in Oersteds). A typical initial value for sensor assemblies made with Alnico-8 magnet is 2000 Oersteds. The next step 136 is to test if Bmin<Bc<Bmax, or if the sensor assembly is tuned within predetermined limits, which are arbitrarily set by the manufacturer. Bmax and Bmin are typically selected such that they are symmetric about Bt and that |Bmax−Bmin|<<|Bop−Brp| for a given sensor. If the assembly meets this test, the tuning process is finished. The next step 138 is to determine if the tuning process has overshot the target. If the tuning direction is negative, and Bc>Bmax, then the sensor assembly has been overtuned, and the process is finished. If the tuning direction is positive, and Bc<Bmin, then the sensor assembly has been overtuned, and the process is finished. In either case, the resultant sensor assembly is defective. In such cases, however, it is often possibly to rework the assembly by remagnetizing and repeating this process.

The next step 140 is to determined the power to apply to the tuning coils. This is done by incrementing the current power level pulse peak field magnitude (in Oersteds). The increment can be determined a variety of ways, such as look-up table, analytic function, or through an adaptive algorithm that learns from experience. An example of a look-up table function is presented herein. The increment is determined by a lookup-table function based on the absolute difference between the target Bt and Bc (|Bc−Bt|). Typical values for this table for tuning a sensor assembly with (Bop−Brp)=2.5 Tesla/meter constructed with an Alnico-8 magnet are:

| \| Bc − Bt \| (in Tesla/meter) | Increment (in Oersteds) |
|---|---|
| >1.25 G | 400 |
| 0.25–1.25 | 150 |
| <0.25 | 50 |

The increment is then added to the current power level to yield a new current power level for the tuning pulse. The next step is to apply a tuning pulse to the assembly at the newly-set current power level. The power is always applied to the 'y' tuning coils 104 106 to produce a positively oriented 'y' field 110, while the power is applied to the 'x' coils 100 102 in the tuning direction previously set in step 132. The final step is to re-characterize Bop, Brp and Bc 144, and loop back to step 136.

The algorithm outlined above can also be modified to switch tuning direction once the tuning process has overshot the target in step 138. In addition, the algorithm could utilize learning techniques (i.e. artificial intelligence or neural nets) based upon the historic tuning process or the manufacturing history for a particular sensor in order to provide a tuning algorithm.

The invention is not limited to the examples described and shown. Various modifications may be made to the examples by one skilled in the art without departing from the scope of the invention.

What is claimed is:

1. A method of adjusting a magnetic proximity detector incorporating a magnet, the magnetic proximity detector being responsive to an externally induced magnetic field gradient normal to a face of the magnetic proximity detector, comprising the steps of:

measuring an operational gradient of a magnetic field normal to said face of said magnetic proximity detector;

determining a modification field that, when applied to said magnetic proximity detector, will adjust a magnetic field axis of said magnet in a predetermined manner;

applying said modification field to said magnetic proximity detector; and removing said modification field from said magnetic proximity detector, whereby said adjusted magnet effects said operational gradient of said magnetic proximity detector.

2. The method of claim 1 wherein the step of measuring an operational gradient of a magnetic field normal to a face of said magnetic proximity detector further comprises the steps of:

applying a sequence of magnetic fields having predetermined gradients to said face of said magnetic proximity detector until a first of said sequence causes an activation of said magnetic proximity detector.

3. The method of claim 2 wherein said sequence of magnetic fields having predetermined gradients comprises a set of magnetic fields having gradients which increase linearly.

4. The method of claim 2 wherein said series of magnetic fields having predetermined gradients comprises a set of magnetic fields having gradients which increase exponentially.

5. The method of claim 2 wherein the step of determining a modification field comprises the steps of:

indexing into a table of predetermined modification values with said first of said sequence of magnetic fields; and retrieving a predetermined modification value associated with said first of said sequence of magnetic field.

6. The method of claim 1 wherein said modification field is substantially parallel to said face of said magnetic proximity detector.

7. The method of claim 1 wherein said modification field is substantially perpendicular to said face of said magnetic proximity detector.

8. The method of claim 1 wherein said modification field is both parallel and perpendicular to said face of said magnetic proximity detector.

9. An apparatus for adjusting the magnetic field of a magnetic proximity detector responsive to an externally induced magnetic field gradient normal to a face of the magnetic proximity detector comprising:

a fixture for securing said magnetic proximity detector, said fixture having an axis substantially perpendicular to a face of said magnetic proximity detector;

actuating means for actuating said magnetic proximity detector, said actuating means mounted in said fixture and having an axis substantially perpendicular to said face of said magnetic proximity detector;

first means for generating a first magnetic field, said first means being arranged relative to said fixture and oriented such that said first magnetic field is substantially perpendicular to said axis; and second means for generating a second magnetic field, said second means being arranged relative to said fixture and oriented such that said second magnetic field is substantially parallel to said axis.

10. The apparatus of claim 9 wherein said first means for generating said first magnetic field comprises at least one coil having a magnetic field axis substantially parallel to said axis.

11. The apparatus of claim 9 wherein said second means for generating said second magnetic field comprises at least one coil having a magnetic field axis substantially perpendicular to said axis.

12. The apparatus of claim 9 further comprising:

computation means adapted to control said first generating means and said second generating means.

13. The apparatus of claim 9 further comprising:

means for measuring the operational gradient of a magnetic field normal to said face of said magnetic proximity detector.

14. The apparatus of claim 12 wherein said computation means is further adapted to control said first generating means and said second generating means based upon said measured operation gradient.

15. In a magnetic proximity detector incorporating a magnet, the magnetic proximity detector being responsive to an externally induced magnetic field gradient normal to a face of the magnetic proximity detector, the improvement comprising adjusting an operational gradient of a magnetic field normal to said face of said magnetic proximity detector in a magnetic field that alters a magnetic field axis of said magnet in a predetermined manner, said magnetic field being applied to said magnetic proximity detector for a predetermined period of time, whereby said altered magnet effects said operational gradient of said magnetic proximity detector.

16. An improved magnetic proximity detector incorporating magnet, the magnetic proximity detector being responsive to an externally induced magnetic field gradient normal to a face of the magnetic proximity detector, produced by a method comprising the steps of:

measuring an operational gradient of a magnetic field normal to a face of said magnetic proximity detector;

determining a modification field that, when applied for a predetermined period of time to said magnetic proximity detector, will adjust a magnetic field axis of said magnet in a predetermined manner; and applying said modification field to said magnetic proximity detector for said predetermined period of time, whereby said adjusted magnet effects said operational gradient of said magnetic proximity detector.

17. The method of claim 16 wherein the step of measuring an operational gradient of a magnetic field normal to a face of said magnetic proximity detector further comprises the steps of:

applying a sequence of magnetic fields having predetermined gradients to said face of said magnetic proximity detector until a first of said sequence causes an activation of said magnetic proximity detector.

18. The method of claim 17 wherein said sequence of magnetic fields having predetermined gradients comprises a set of magnetic fields having gradients which increase linearly.

19. The method of claim 17 wherein said series of magnetic fields having predetermined gradients comprises a set of magnetic fields having gradients which increase exponentially.

20. The method of claim 17 wherein the step of determining a modification field comprises the steps of:

indexing into a table of predetermined modification values with said first of said sequence of magnetic fields; and retrieving a predetermined modification value associated with said first of said sequence of magnetic field.

* * * * *

UNITED STATES PATENT AND TRADEMARK OFFICE
CERTIFICATE OF CORRECTION

PATENT NO. : 5,818,222
DATED : October 6, 1998
INVENTOR(S) : Edward A. Ramsden

It is certified that error appears in the above-identified patent and that said Letters Patent is hereby corrected as shown below:

Title page,
Column 2, ABSTRACT,
Line 7, change "discloses" to -- disclosed --.

Column 3,
Line 46, change "filed" to -- field --.

Column 4,
Line 42, change "5C, illustrate" to -- 5C illustrate --.

Column 6,
Line 65, change " 'y" to -- 'y' --.

Column 7,
Line 54, change "possibly" to -- possible --.
Line 56, change "determined" to -- determine --.

Column 8,
Line 12, change "coils 104 106" to -- coils 104, 106 --.
Line 14, change "coils 100 102" to -- coils 100, 102 --.

Claim 5,
Line 7, change "field" to -- fields --.

Claim 16,
Lines 1-2, change "incorporating magnet," to -- incorporating a magnet, --.

Claim 20,
Line 7, change "field" to -- fields --.

Signed and Sealed this

Fourth Day of December, 2001

*Attest:*

NICHOLAS P. GODICI
*Attesting Officer*  *Acting Director of the United States Patent and Trademark Office*